(12) United States Patent
Peng et al.

(10) Patent No.: US 8,482,332 B2
(45) Date of Patent: Jul. 9, 2013

(54) MULTI-PHASE CLOCK GENERATOR AND DATA TRANSMISSION LINES

(75) Inventors: Yung-Chow Peng, Hsin-Chu (TW); Min-Shueh Yuan, Taipei (TW); Chih-Hsien Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 113 days.

(21) Appl. No.: 13/089,160

(22) Filed: Apr. 18, 2011

(65) Prior Publication Data
US 2012/0262209 A1     Oct. 18, 2012

(51) Int. Cl.
*H03K 3/00*     (2006.01)
(52) U.S. Cl.
USPC ........... 327/291; 327/293; 327/295; 375/355; 375/373

(58) Field of Classification Search
USPC ................. 327/291–293, 295–297; 375/327, 375/328, 355, 373
See application file for complete search history.

(56) References Cited

U.S. PATENT DOCUMENTS

| | | | |
|---|---|---|---|
| 5,748,125 A | 5/1998 | Cederbaum et al. | |
| 7,254,201 B2 * | 8/2007 | Kim | 375/354 |
| 7,912,167 B2 * | 3/2011 | Saeki | 375/355 |
| 2002/0114416 A1 * | 8/2002 | Enam et al. | 375/373 |
| 2006/0238227 A1 | 10/2006 | Kim et al. | |

* cited by examiner

*Primary Examiner* — An Luu
(74) *Attorney, Agent, or Firm* — Slater & Matsil, L.L.P.

(57) ABSTRACT

An embodiment is an integrated circuit. The integrated circuit comprises a clock generator and data transmission lines. The clock generator generates clock signals. At least some of the clock signals have a phase difference from an input clock signal input into the clock generator, and at least some of the clock signals have a different phase difference with respect to at least another of the clock signals. Each of the data transmission lines is triggered at least in part by at least one of the clock signals.

18 Claims, 4 Drawing Sheets

MULTI-PHASE CLOCK GENERATOR AND DATA TRANSMISSION LINES

BACKGROUND

Generally, integrated circuits have many transmission lines that carry signals between various portions of the chip during operation of the integrated circuit. Typically, the transitioning of digital data on a transmission line may cause noise in a power or ground supply which could degrade the quality of signals on the chip. With multiple transmission lines and multiple signals transitioning states, noise may be exacerbated. For example, this problem may be increased in recent 2.5D or 3D structures that include a plurality of chips with each having many transmission lines using common power and ground supplies.

One attempted solution to the noise generated is to create more power and ground inputs/outputs (I/Os). However, more power and ground I/Os generally result in an area penalty. The area penalty may be unacceptable for a high volume data line.

Another attempted solution is to reduce an inductance coupled to the power and ground supplies to reduce the noise. However, reducing the inductance may not be practicable for some applications because it may not meet a limitation of a package's minimum inductance and because manufacturing the inductance may be process intensive and expensive.

Accordingly, there is a need in the art to overcome the above stated problem without, for example, the above identified disadvantages of attempted solutions.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable novel concepts that can be embodied in a wide variety of specific contexts. The specific embodiments discussed are merely illustrative of specific ways to make and use the concepts disclosed, and are not limiting.

Embodiments are described in a specific context, namely a system comprising data transmission lines in an integrated circuit. It should be noted that a transmission line may include a conductive line, a transmission bus, the like, and/or a combination thereof. The disclosure may also be applied, however, to any integrated circuit configuration, such as a single chip package, a 2.5D package, or a 3D package.

Figure 1:
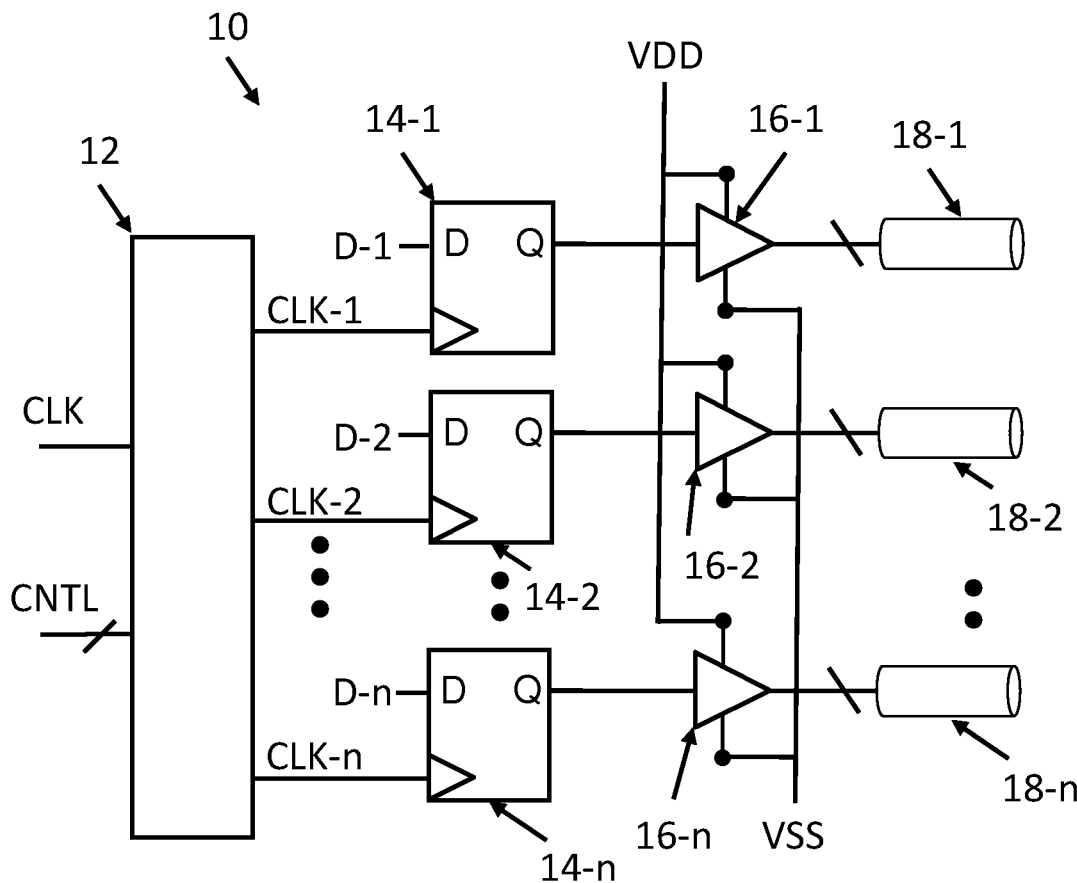
FIG. 1 is a system comprising a multi-phase clock generator with data transmission lines according to an embodiment.

FIG. 1 is a system 10 comprising a multi-phase clock generator 12 with data transmission lines 18-1, 18-2, to 18-$n$ according to an embodiment. The multi-phase clock generator 12 receives an input clock signal CLK and a j-bit control signal CNTL and generates multiple clock signals, such as clock signals CLK-1, CLK-2, to CLK-n, where n is the number of clock signals generated. Each of the generated clock signals CLK-1 to CLK-n generally has a different phase from the input clock signal CLK or has different delay propagations from the input clock signal CLK although some of the generated clock signals CLK-1 to CLK-n may have a same phase or delay from the input clock signal CLK. As is known in the art, a phase difference generally refers to an angular difference of a function or signal with respect to another function or signal, and a delay generally refers to a timing difference of a function or signal with respect to another function or signal. Each of the generated clock signals CLK-1 to CLK-n drives a respective one of data latches 14-1, 14-2, to 14-$n$, which may also be any flip-flop. Each of the data latches 14-1 to 14-$n$ has a respective data input D-1, D-2, to D-n that is to be transmitted along a respective transmission line 18-1 to 18-$n$. The output of each of the data latches 14-1 to 14-$n$ is input to a respective buffer 16-1, 16-2, to 16-$n$. Each of the respective buffers 16-1 to 16-$n$ is electrically coupled between a power source VDD and ground VSS, and each of the buffers 16-1 to 16-$n$ acts as a low impedance driver for transmitting a data signal along a respective data transmission line 18-1 to 18-$n$.

Figure 2:
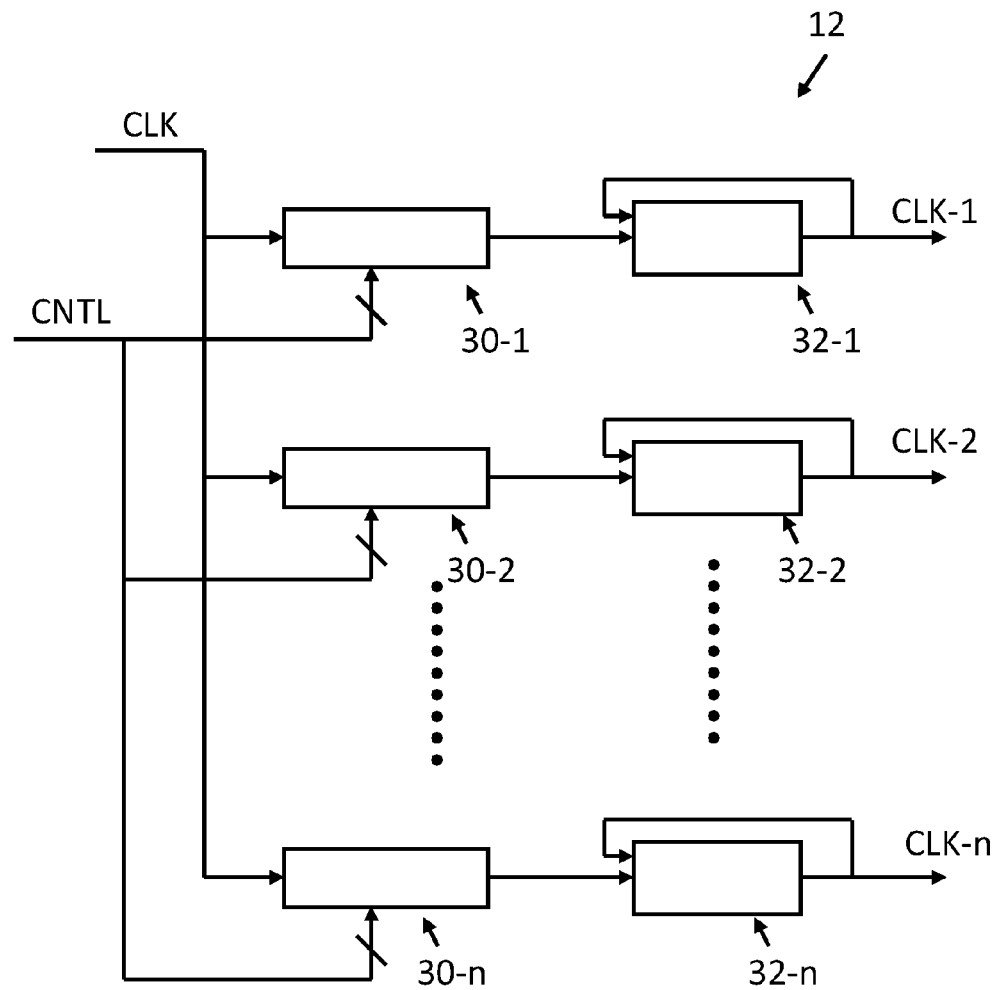
FIG. 2 is an example of the multi-phase clock generator according to an embodiment.

FIG. 2 illustrates an example of the multi-phase clock generator 12 according to an embodiment. The input clock signal CLK is input into each of delay lines 30-1, 30-2, to 30-$n$. Each of the delay lines 30-1 to 30-$n$ generally delays the input clock signal CLK by some amount although one or more of the delay lines 30-1 to 30-$n$ may not delay the input clock signal CLK. The delay lines 30-1 to 30-$n$ may each have a fixed delay or may have a configurable delay based on some bits of the control signal CNTL, as will be illustrated in further detail below. The output of each delay line 30-1 to 30-$n$ is input into a respective delay locked loop (DLL) or phase locked loop (PLL) 32-1, 32-2, to 32-$n$, such as a deskew DLL or PLL. The DLLs/PLLs 32-1 to 32-$n$ output a respective one of the generated clock signals CLK-1 to CLK-n. A configuration of a DLL or a PLL is well known in the art. A PLL generally functions to generate an output signal having a phase "locked" or matched with an input signal. Similarly, a DLL generally functions to generate an output signal having a delay locked with an input signal.

The control signal CNTL may be any bits wide, such as j bits, and may vary depending upon the embodiment. It is worth noting that although various bits of the control signal CNTL are depicted as being input directly into the delay lines 30-1 to 30-$n$, the control signal CNTL may be input into intervening control logic with outputs from the control logic being input into the delay lines 30-1 to 30-$n$. A person having ordinary skill in the art will readily understand possible configurations of control logic based on the description of embodiments described herein.

Figure 3:
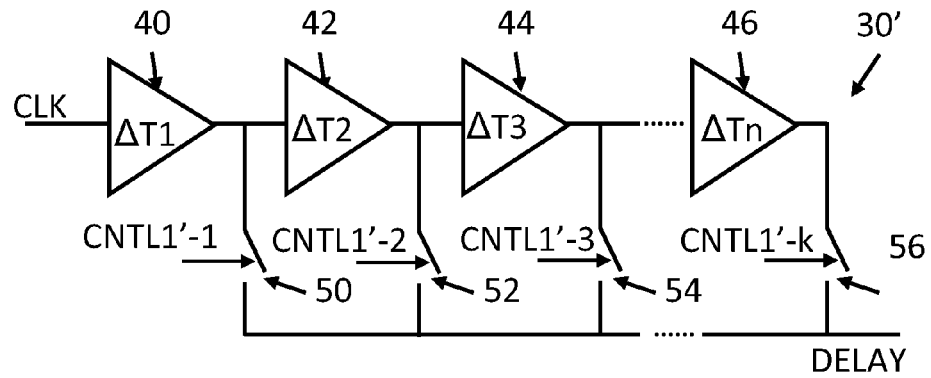
FIG. 3 is a first example of a delay line with a configurable delay according to an embodiment.

FIG. 3 depicts a first example of a delay line 30' with a configurable delay. The input clock signal CLK is input into serially connected N number of delay units, with delay units 40, 42, 44, and 46 depicted. In this embodiment, each delay unit 40, 42, 44, and 46 is a buffer, such as two serially connected inverters, that apply a delay $\Delta Tn$ to a signal input into the buffer. The delays $\Delta T1$, $\Delta T2$, $\Delta T3$, and $\Delta Tn$ for the respective delay units 40, 42, 44, and 46 may be the same or may be different, for example, depending on design choice. The output of each of the delay units 40, 42, 44, and 46 is coupled to a respective switch 50, 52, 54, and 56 that is controlled by a respective bit CNTL1'-1, CNTL1'-2, CNTL1'-3, and CNTL1'-k, of the various bits of the control signal CNTL input into the delay line 30'. The switches 50, 52, 54, and 56 have output nodes coupled together to output a delay signal DELAY. In this configuration, when one of the switches 50, 52, 54, and 56 is closed, the others remain open such that the delay signal DELAY has a delay relative to the clock signal CLK that corresponds to the number of delay units through which the delay is propagated before passing through the closed switch and output as the delay signal DELAY. For example, if switch 52 is closed and switches 50, 54, and 56 are open, the delay signal DELAY has a delay of 2ΔT corresponding to the delay caused by delay units 40 and 42.

Figure 4:
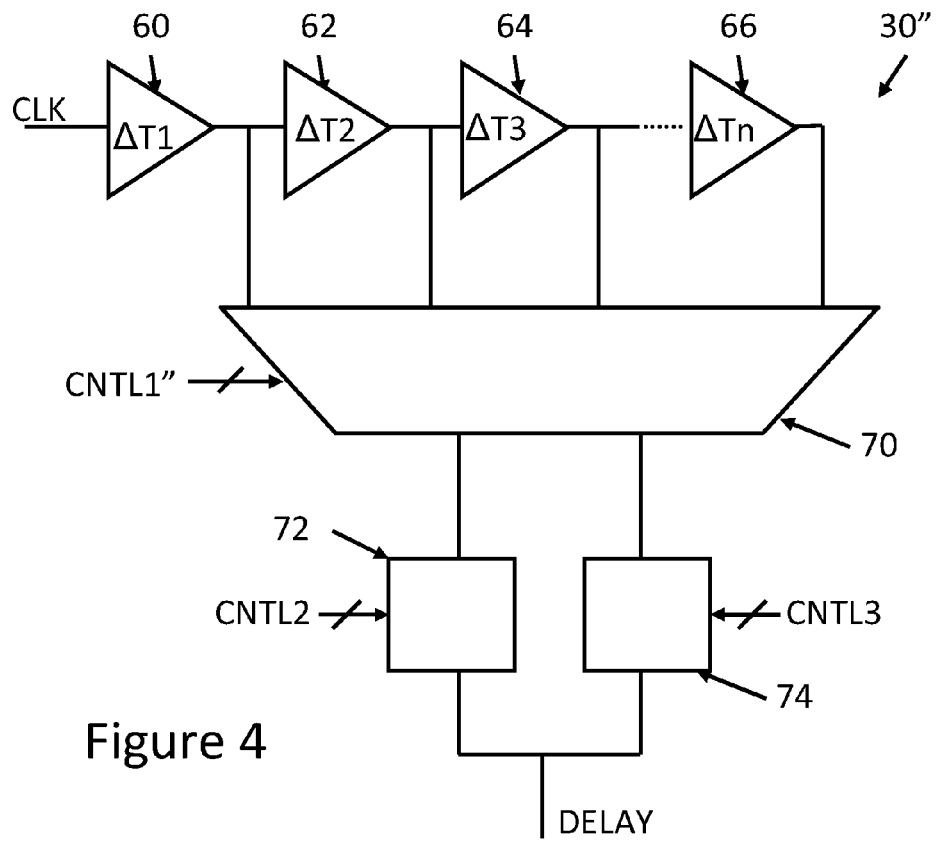
FIG. 4 is a second example of a delay line with a configurable delay according to an embodiment.
Figure 5:
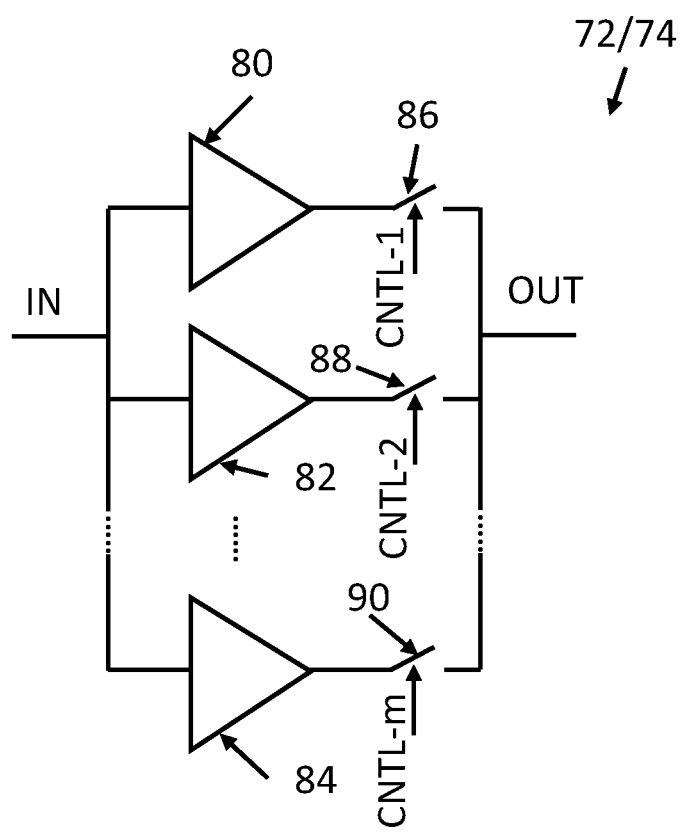
FIG. 5 is an example of an adaptive buffer according to an embodiment.

FIG. 4 depicts a second example of a delay line 30" with a configurable delay, such as an exemplary interpolator. The input clock signal CLK is input into serially connected N number of delay units, with delay units 60, 62, 64, and 66 depicted. The delay units in FIG. 4 may be the same or similar to the delay units in FIG. 3. The output of each of the delay units 60, 62, 64, and 66 is input into an N-to-2 multiplexer 70. The multiplexer 70 outputs two delay signals selected based on the control signal CNTL1", which is bits of the control signal CNTL input into the delay line 30". The outputs of the multiplexer 70 are input into respective adaptive buffers 72 and 74, such as shown in FIG. 5. Based on respective control signals CNTL2 and CNTL3, each being bits of the control signal CNTL, input into the adaptive buffers 72 and 74, the adaptive buffers 72 and 74 are coupled together to output the delay signal DELAY. The delay of the delay signal DELAY has a delay that corresponds to a delay between the delays of the two signals output from the multiplexer 70. For example, if the output of the delay unit 60 having a delay ΔT and the output of the delay unit 62 having a delay 2ΔT are output by the multiplexer 70, the delay signal DELAY may have a delay between ΔT and 2ΔT.

FIG. 5 illustrates an adaptive buffer 72/74 of the delay line 30" of FIG. 4. The adaptive buffer 72/74 includes buffers 80, 82, and 84. Each of the buffers 80, 82, and 84 has an input signal IN from, for example, one of the outputs of the multiplexer 70 in FIG. 4. Each of the buffers 80, 82, and 84 is coupled to a respective switch 86, 88, and 90, with each switch 86, 88, and 90 being controllable by a respective bit of a control signal CNTL-1, CNTL-2, CNTL-m, which each is a bit of CNTL2 or CNTL3 as shown in FIG. 4. The outputs of the switches 86, 88, and 90 are coupled together and output an output signal OUT, which may be coupled to the output signal OUT of the other adaptive buffer to output the delay signal DELAY of FIG. 4.

Referring to both FIGS. 4 and 5, the bits of the control signals CNTL2 and CNTL3 provide weights to determine the delay of the delay signal DELAY output by the interpolator. For example, if the control signal CNTL2 has bits that weight the driving strength significantly more than bits of the control signal CNTL3, the delay signal DELAY will have a delay that is nearer to the delay of the signal input into the adaptive buffer 72 than to the delay of the signal input into the adaptive buffer 74. If, for example, the control signal CNTL3 has bits that weight the driving strength significantly more than bits of the control signal CNTL2, the delay signal DELAY will generally have a delay that is nearer to the delay of the signal input into the adaptive buffer 74 than to the delay of the signal input into the adaptive buffer 72. Further, if the control signals CNTL2 and CNTL3 are equally weighted, the delay signal DELAY generally will have a delay that is nearer to half of the difference of the delays input into the respective adaptive buffers 72 and 74 plus the delay of the signal with the smallest delay. For example, if signals with delays ΔT and 2ΔT are input into the adaptive buffers 72 and 74, respectively, and the control signals are weighted equally, the delay of the delay signal DELAY will generally be ΔT+½(2ΔT−ΔT). A person having ordinary skill in the art will readily understand the different weighting of the control signals CNTL2 and CNTL3 to obtain various delays and to implement equivalent circuits, both of which are contemplated by embodiments.

An embodiment, such as those shown in FIGS. 1 through 4, may generate clock signals having different phases. The different phases may be integer multiples of a delay, such as ΔT above, or may be any generated difference. The clock signals may then drive respective data latches having data input therein. The output of the data latches is transmitted along respective transmission lines, for example, across a semiconductor chip. By having the clock signals having different phases, the data transitions on the transmission lines may occur having asynchronous timing. The asynchronous timing of the transitions may result in fewer transitions occurring at a single instant and thus may reduce the amount of noise on the power or ground plane that is generated by simultaneous switching output compared to use of only a single clock. Further, a timing margin may be increased for low swing transmissions, and a power consumption of transmission signals may be decreased due to the shifted time intervals.

An embodiment is an integrated circuit. The integrated circuit comprises a clock generator and data transmission lines. The clock generator generates clock signals. At least some of the clock signals have a phase difference from an input clock signal input into the clock generator, and at least some of the clock signals have a different phase difference with respect to at least another of the clock signals. Each of the data transmission lines is triggered at least in part by at least one of the clock signals.

Another embodiment is an integrated circuit. The integrated circuit comprises a multi-phase clock generator that comprises configurable delay lines and delay locked loops (DLLs) and/or phase locked loops (PLLs). The multi-phase clock generator has a plurality of output clock signals. Each of the plurality of the output clock signals has a delay with respect to an input clock signal, and at least some of the output clock signals have a different delay compared to at least another of the output clock signals. The output clock signals trigger respective data transmission lines. Each of the configurable delay lines each has the input clock signal as an input. Each of the DLLs and/or PLLs has an output of one of the configurable delay lines as an input, and each of the DLLs and/or PLLs outputs one of the output clock signals.

A further embodiment is method that comprises generating a plurality of phase-shifted clock signals; triggering flip-flops based on the phase-shifted clock signals; and outputting data signals from the flip-flops onto transmission lines. Each of the phase-shifted clock signals has a different phase shift relative to others of the phase-shifted clock signals.

Although the present embodiments and their advantages have been described in detail, it should be understood that various changes, substitutions and alterations can be made herein without departing from the spirit and scope of the disclosure as defined by the appended claims. For example, the input clock signal CLK in FIGS. 1 through 4 may be used to drive a data latch used for data transmission along a transmission line along with at least one other phase shifted clock signal driving another data latch. Further, the input clock signal CLK may be delivered directly to a data latch or may be passed through a delay line, such as by being diverted through a switch coupled to the input of the delay line. Also, many other configurations of the delay lines may be used and are considered within the knowledge of a person having ordinary skill in the art without undue experimentation. Even further, each delay line may have a fixed, non-configurable delay, such as by having a number of serially connected delay units corresponding to the desired phase shift. For example, if a 2ΔT phase shift is desired, only two delay units may be serially connected such that the delay signal has the desired phase shift. The above figures illustrate broken lines to show how more or less components of the figures are considered within embodiments.

Also, embodiments contemplate that control logic may be used in various components. As discussed above, the multi-phase clock generator 12 may have intervening control logic. Further, each delay line may have control logic, which may be the same or different from other delay lines, such that respective control signals may be input into the control logic and outputs of the control logic may control respective components. These configurations are considered within the skill and knowledge of a person having ordinary skill in the art.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit comprising:
    a clock generator that generates clock signals, at least some of the clock signals having a phase difference from an input clock signal input into the clock generator, at least some of the clock signals having a different phase difference with respect to at least another of the clock signals, the clock generator comprising configurable delay lines each coupled to the input clock signal, at least one of the configurable delay lines corresponding to at least one of the clock signals; and
    data transmission lines, each of the data transmission lines being triggered at least in part by at least one of the clock signals.

2. The integrated circuit of claim 1, wherein each of the configurable delay lines has an output electrically coupled to a phase locked loop (PLL), a delay locked loop (DLL), or a combination thereof.

3. The integrated circuit of claim 1, wherein each of the configurable delay lines is configured to output a signal having a variable phase difference from the input clock signal based on a control signal.

4. The integrated circuit of claim 1, wherein each of the configurable delay lines comprises:
    serially connected delay units; and
    controllable switches, each of the controllable switches being electrically coupled to an output of one of the delay units, outputs of the controllable switches being electrically coupled together.

5. The integrated circuit of claim 4, wherein each of the serially connected delay units comprises a delay buffer.

6. The integrated circuit of claim 1, wherein each of the configurable delay lines comprises:
    serially connected delay units; and
    a multiplexer having inputs electrically coupled to outputs of the serially connected delay units and having at least two selected outputs; and
    adaptive buffers, each adaptive buffer being electrically coupled to respective ones of the at least two selected outputs, outputs of the adaptive buffers being electrically coupled together.

7. The integrated circuit of claim 1 further comprising:
    data latches, each of the data latches having a data input and a data output triggered by a respective one of the clock signals; and
    output buffers, each of the output buffers having an input that is the data output of one of the data latches, an output of each of the output buffers being electrically coupled to a respective one of the transmission lines.

8. An integrated circuit comprising:
    a multi-phase clock generator having a plurality of output clock signals, each of the plurality of the output clock signals having a delay with respect to an input clock signal, at least some of the output clock signals having a different delay compared to at least another of the output clock signals, the output clock signals triggering respective data transmission lines, the multi-phase clock generator comprising:
        configurable delay lines each having the input clock signal as an input; and
        delay locked loops (DLLs) and/or phase locked loops (PLLs), each of the DLLs and/or PLLs having an output of one of the configurable delay lines as an input, and each of the DLLs and/or PLLs outputting one of the output clock signals.

9. The integrated circuit of claim 8, wherein each of the configurable delay lines comprises:
    delay units being serially connected, the delay units having corresponding delay outputs; and
    switches controllable by a control signal, the control signal selecting an output node of one of the switches as one of the clock signals.

10. The integrated circuit of claim 9, wherein each of the delay units comprises a buffer.

11. The integrated circuit of claim 8, wherein each of the configurable delay lines comprises an interpolator.

12. The integrated circuit of claim 8, wherein each of the configurable delay lines comprises:
    delay units being serially connected, the delay units having corresponding delay outputs;
    an N-to-2 multiplexer having the delay outputs as inputs and having two selected outputs; and
    adaptive buffers each having one of the two selected outputs as an input, outputs of the adaptive buffers being electrically coupled together.

13. The integrated circuit of claim 12, wherein each of the adaptive buffers comprises:
    buffers electrically having inputs electrically coupled together; and
    switches having outputs electrically coupled together, an input of each switch being electrically coupled to an output of a respective buffer.

14. A method comprising:
    generating a plurality of phase-shifted clock signals, each of the phase-shifted clock signals having a different phase shift relative to others of the phase-shifted clock signals, the generating the phase-shifted clock signals comprising passing a clock signal through delay lines, each of the delay lines providing a variable delay;
    triggering flip-flops based on the phase-shifted clock signals; and outputting data signals from the flip-flops onto transmission lines.

15. The method of claim 14, wherein the generating the phase-shifted clock signals comprises configuring delay lines to provide delays for the phase-shifted clock signals based on a control signal.

16. The method of claim 14, wherein each of the variable delays is provided by switching an output of the delay line between outputs of serially connected delay units.

17. The method of claim 14, wherein each of the variable delays is provided by selecting outputs of serially connected delay units and determining the variable delay that is between or greater than the selected outputs.

18. The method of claim 14 further comprising buffering the data signals from the flip-flops before the data signals are output onto the transmission lines.

* * * * *